United States Patent
Chiba et al.

(10) Patent No.: US 12,144,261 B2
(45) Date of Patent: Nov. 12, 2024

(54) DIELECTRIC ELASTOMER TRANSDUCER AND METHOD FOR PRODUCING DIELECTRIC ELASTOMER TRANSDUCER

(71) Applicants: Seiki Chiba, Tokyo (JP); Mikio Waki, Sakura (JP); ZEON CORPORATION, Tokyo (JP)

(72) Inventors: Seiki Chiba, Tokyo (JP); Mikio Waki, Sakura (JP); Noriyuki Oya, Nagoya (JP); Makoto Takeshita, Tokyo (JP); Mitsugu Uejima, Tokyo (JP)

(73) Assignees: Seiki Chiba, Tokyo (JP); Mikio Waki, Sakura (JP); ZEON CORPORATION, Tokyo (JP)

( * ) Notice: Subject to any disclaimer, the term of this patent is extended or adjusted under 35 U.S.C. 154(b) by 682 days.

(21) Appl. No.: 17/422,749

(22) PCT Filed: Jan. 16, 2020

(86) PCT No.: PCT/JP2020/001210
§ 371 (c)(1),
(2) Date: Jul. 14, 2021

(87) PCT Pub. No.: WO2020/149353
PCT Pub. Date: Jul. 23, 2020

(65) Prior Publication Data
US 2022/0131066 A1 Apr. 28, 2022

(30) Foreign Application Priority Data
Jan. 18, 2019 (JP) .................................. 2019-007012

(51) Int. Cl.
*H10N 30/87* (2023.01)
*H10N 30/20* (2023.01)
*H10N 30/30* (2023.01)

(52) U.S. Cl.
CPC ......... *H10N 30/878* (2023.02); *H10N 30/206* (2023.02); *H10N 30/302* (2023.02)

(58) Field of Classification Search
CPC .. H10N 30/878; H10N 30/206; H10N 30/302; H10N 30/06; H10N 30/857
(Continued)

(56) References Cited

U.S. PATENT DOCUMENTS

2012/0177934 A1* 7/2012 Vogel .................. H01M 4/13
977/734
2014/0004364 A1* 1/2014 Takahashi .............. C08J 5/18
428/465
(Continued)

FOREIGN PATENT DOCUMENTS

JP 4383505 B1 12/2009
JP 4999031 B1 8/2012
(Continued)

OTHER PUBLICATIONS

Feb. 10, 2020, International Search Report issued in the International Patent Application No. PCT/JP2020/001210.
(Continued)

Primary Examiner — Emily P Pham
(74) Attorney, Agent, or Firm — KENJA IP LAW PC

(57) ABSTRACT

A dielectric elastomer transducer A1 includes a dielectric elastomer layer 11 and a pair of electrode layers 12 sandwiching the dielectric elastomer layer 11. The electrode layers 12 contain ground carbon particles derived from carbon nanotubes. This configuration ensures both stretchability and electrical conductivity.

7 Claims, 2 Drawing Sheets

(58) Field of Classification Search
CPC .............. C01P 2004/50; C01P 2004/61; C01P 2004/62; C01B 32/168; C01B 32/174
See application file for complete search history.

(56) References Cited

U.S. PATENT DOCUMENTS

| | | | |
|---|---|---|---|
| 2014/0202744 A1* | 7/2014 | Kobayashi | C08K 3/041 252/511 |
| 2016/0111626 A1 | 4/2016 | Takagaki et al. | |
| 2017/0077497 A1* | 3/2017 | Ogata | H01M 4/587 |

FOREIGN PATENT DOCUMENTS

| JP | 2015200501 A | 11/2015 |
|---|---|---|
| JP | 5829328 B2 | 12/2015 |
| JP | 2016069456 A | 5/2016 |
| JP | 2017034923 A | 2/2017 |
| WO | 2015029656 A1 | 3/2015 |

OTHER PUBLICATIONS

Nov. 22, 2022, the Extended European Search Report issued by the European Patent Office in the corresponding European Patent Application No. 20741059.8.

* cited by examiner

DIELECTRIC ELASTOMER TRANSDUCER AND METHOD FOR PRODUCING DIELECTRIC ELASTOMER TRANSDUCER

TECHNICAL FIELD

The present invention relates to a dielectric elastomer transducer and a method for producing a dielectric elastomer transducer.

BACKGROUND ART

A dielectric elastomer transducer includes a dielectric elastomer layer sandwiched between a pair of electrode layers. Such a dielectric elastomer transducer is expected to find a variety of applications, including actuation, power generation and sensing. Patent Document 1 discloses a conventional dielectric elastomer transducer. In the document, examples of construction materials for electrode layers are listed, including silver nanowires, carbon nanowires, carbon nanotubes and carbon nanofiller.

PRIOR ART DOCUMENT

Patent Document

Patent Document 1: JP-A-2017-34923

SUMMARY OF THE INVENTION

Problem to be Solved by the Invention

Typical uses of a dielectric elastomer transducer take advantage that the dielectric elastomer layer is highly stretchable. The electrode layers hence need to be sufficiently stretchable to be able to follow expansion and contraction of the dielectric elastomer layer. At the same time, the electrode layers need to pass the electric charge (voltage) applied thereto. It is therefore necessary to ensure that expansion and contraction of the electrode layers will not break the electrical continuity.

The present invention has been conceived in view of the circumstances described above and aims to provide a dielectric elastomer transducer ensuring both the requested stretchability and electrical conductivity and also to provide a method for producing such a dielectric elastomer transducer.

Means to Solve the Problem

A first aspect of the present invention provides a dielectric elastomer transducer including a dielectric elastomer layer and a pair of electrode layers sandwiching the dielectric elastomer layer. The electrode layers contain ground carbon particles derived from carbon nanotubes.

In a preferred embodiment of the present invention, the ground carbon particles have a particle size ranging from 0.5 to 1.5 μm as measured by dynamic light scattering and a particle size ranging from 15 to 70 μm as measured by laser scattering.

In a preferred embodiment of the present invention, the ground carbon particles satisfy that a difference between the particle size as measured by dynamic light scattering and the particle size as measured by laser scattering is at least 15 μm.

In a preferred embodiment of the present invention, the ground carbon particles satisfy that a ratio between the particle size as measured by laser scattering and the particle size as measured by dynamic light scattering is at least 15.

A second aspect of the present invention provides a method for producing a dielectric elastomer transducer that includes a dielectric elastomer layer and a pair of electrode layers sandwiching the dielectric elastomer layer. The method includes: a step of grinding carbon nanotubes to obtain ground carbon particles; and a step of depositing the pair of electrode layers made of the ground carbon particles on the dielectric elastomer layer.

In a preferred embodiment of the present invention, the step of grinding is performed to obtain the ground carbon particles having a particle size ranging from 0.5 to 1.5 μm as measured by dynamic light scattering and a particle size of at least 15 μm as measured by laser scattering.

In a preferred embodiment of the present invention, the step of grinding is performed to obtain the ground carbon particles satisfying that a difference between the particle size as measured by dynamic light scattering and the particle size as measured by laser scattering is at least 15 μm.

In a preferred embodiment of the present invention, the step of grinding is performed to obtain the ground carbon particles satisfying that a ratio between the particle size as measured by laser scattering and the particle size as measured by dynamic light scattering is at least 15.

In a preferred embodiment of the present invention, the step of grinding includes: pretreatment of dispersing carbon nanotubes in a solvent to obtain a first dispersion of carbon nanotubes and removing the solvent to obtain a powder of carbon nanotubes; and grinding the powder of carbon nanotubes into a finer powder of carbon nanotubes, mixing the finer powder of carbon nanotubes with a solvent to obtain a second dispersion of carbon nanotubes; and allowing the second dispersion of carbon nanotubes to stand and then extracting a portion of the second dispersion from a location near a liquid surface of the second dispersion.

Advantages of the Invention

According to the present invention, both the stretchability and electrical conductivity can be ensured.

Other features and advantages of the present invention will be more apparent from detailed description given below with reference to the accompanying drawings.

MODE FOR CARRYING OUT THE INVENTION

Preferred embodiments of the present invention will be described below with reference to the drawings.

Figure 1:
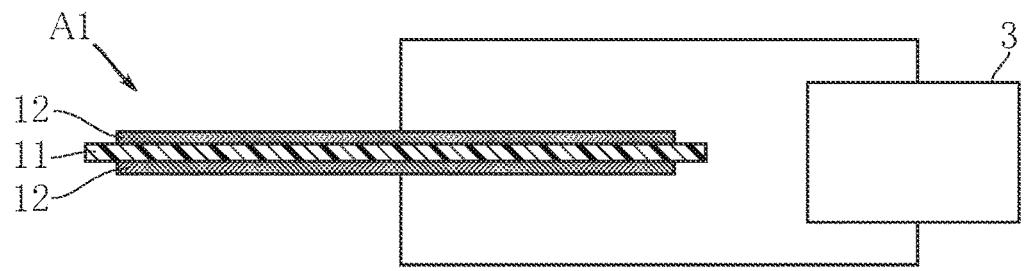
FIG. 1 is a sectional view of a dielectric elastomer transducer according to the present invention.

FIG. 1 shows an example of a dielectric elastomer transducer according to the present invention. A dielectric elastomer transducer A1 of the present embodiment includes a dielectric elastomer layer 11 and a pair of electrode layers 12.

The dielectric elastomer transducer A1 can be used in a variety of applications, including actuation, power generation and sensing, rather than being limited to a specific application. When, for example, the dielectric elastomer transducer A1 is used as an actuator, an electric circuit device 3 is employed to apply electric charge (voltage) to the pair of electrode layers 12. The voltage to be applied may be a high voltage above several hundred volts.

The dielectric elastomer layer 11 contains one or more elastomers (polymers having rubber-like elasticity). Examples of the elastomers include, but not limited to, thermoset elastomers and thermoplastic elastomer.

Examples of thermoset elastomers include, but not limited to, natural rubber, synthetic rubber, silicone rubber elastomers, urethane rubber elastomers and fluorocarbon rubber elastomers.

Thermoplastic elastomers include copolymers of aromatic vinyl monomers and conjugated diene monomers. Specific examples of copolymers of aromatic vinyl monomers and conjugated diene monomers include: diblock polymers, such as styrene-butadiene block copolymers and styrene-isoprene block polymers; triblock polymers, such as styrene-butadiene-styrene block polymers, styrene-isoprene-styrene (SIS) block polymers, styrene-butadiene-isoprene block polymers, and styrene-isobutylene-styrene (SIBS) block polymers; styrene-containing multiblock polymers, such as styrene-butadiene-styrene-butadiene block polymers, styrene-isoprene-styrene-isoprene block polymers, styrene-butadiene-isoprene-styrene block polymers, styrene-butadiene-styrene-isoprene block polymers and styrene-isobutylene-butadiene-styrene block polymers; and their hydrogenated or partially-hydrogenated additives. Among these, block polymers such as SIS are particularly preferable.

In addition to the elastomers listed above, the dielectric elastomer layer 11 may contain one or more other materials, such as various types of additives.

The dielectric elastomer layer 11 is not limited to any specific shape. For example, the dielectric elastomer layer 11 may be annular in plan view or rolled into a tubular shape, in a state before fitted to the dielectric elastomer transducer A1 and thus without external forces.

The electrode layers 12 are disposed to sandwich the dielectric elastomer layer 11. The electrode layers 12 are made of a material that is electrically conductive and elastically deformable to follow elastic deformation of the dielectric elastomer layer 11. Examples of such a material include an elastically deformable material mixed with conductive fillers, which impart electrical conductivity. In the present embodiment, the fillers include ground or crushed carbon particles derived from carbon nanotubes.

Figure 2:
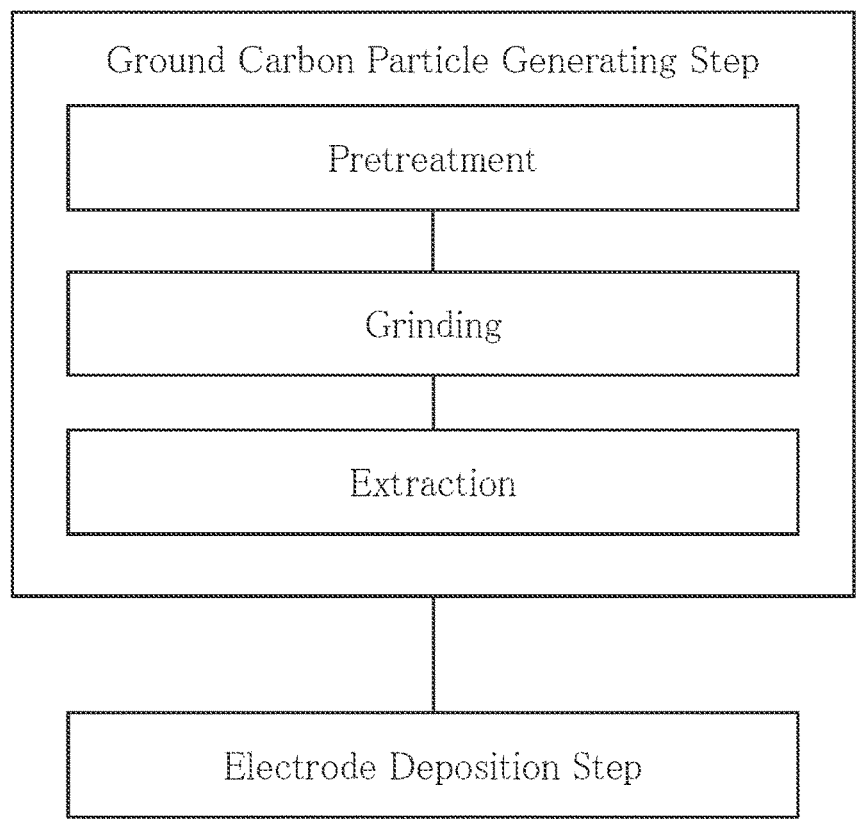
FIG. 2 is a flowchart of a method for producing a dielectric elastomer transducer according to the present invention.

FIG. 2 shows an example of a method for producing the dielectric elastomer transducer A1. The method of the present embodiment includes a ground carbon particle generating step and an electrode deposition step. In the ground carbon particle generating step, carbon nanotubes are ground to obtain ground carbon particles derived from carbon nanotubes. In the electrode deposition step, an electrode layer containing ground carbon particles is deposited on each side of the dielectric elastomer layer.

EXAMPLE

The following describes Example of the ground carbon particle generating step. Note, however, that the ground carbon particle generating step of the present invention is not specifically limited and may employ a variety of processes that can generate ground carbon particles satisfying the later-described conditions.

Pretreatment

First, single-wall carbon nanotubes (hereinafter SWCNT: e.g., SG101 available from Zeon Corporation) were mixed with a solvent to prepare a solution containing 0.35 wt % of SWCNTs. Here, methyl ethyl ketone (MEK) was used as the solvent. The resultant solution was homogenized by a high-pressure homogenizer to prepare a SWCNT dispersion (first dispersion). Then, the SWCNT dispersion was left to stand at the dispersion temperature of about 20° to 40° C. to remove the solvent. Then, the residue was stirred with a glass stirring rod to form a powder.

Grinding

Then, the resultant powder of SWCNTs was ground by a planetary ball mill to obtain a finer powder of SWCNTs. A solvent was added to the finer powder of SWCNTs and the resultant solution was homogenized for a second time by a high-pressure homogenizer. This time, cyclohexane (CyH) was used as the solvent. The SWCNT content was 0.07 to 0.15 wt %. After the second homogenization, the SWCNT dispersion (second dispersion) was transferred to, for example, a glass vessel and subjected to ultrasonic vibrations. The dispersion was then allowed to stand for 24 hours to confirm that no separation of SWCNTs and the solvent occurred. In a case where separation was observed, the dispersion would be subjected to ultrasonic vibrations again.

Extraction

After the confirmation that SWCNTs and the solvent did not separate, the dispersion was further subjected to ultrasonic vibrations and allowed to stand for about 30 minutes. Then, the upper portion of the SWCNT dispersion near the liquid surface was drawn up into a syringe and transferred to another vessel.

Comparative Examples

In Comparative Example 1, a SWCNT dispersion of unground SWCNTs was prepared by using CyH as a solvent. In Comparative Examples 2 and 3, common types of carbon black were prepared. The nominal particle diameters of the carbon black provided by the manufacture were within a range of 15 to 55 nm. In Comparative Example 2, a dispersion of the carbon black was prepared by using CyH, which is the same solvent as used in Example. In Comparative Example 3, a dispersion of the carbon black was prepared by using MEK as a solvent.

Pre-Dilution Before Particle Size Measurement (1-1) From each dispersion of Example and Comparative Example 1 to 3, a 2 ml sample was collected into a glass vessel, and isopropyl alcohol (IPA: Kanto Chemical, Cica Grade 1) was added to each sample to obtain a pre-diluted solution.

(1-2) The pre-diluted solution in each vessel was stirred with e.g., a magnetic stirrer, and subjected to ultrasonification under the following conditions: the ultrasonic frequency of 39 kHz, the output power of 100 W, and the irradiation time of 3 minutes.

(1-3) The particle size measurement was performed within 10 minutes after the ultrasonification.

Dynamic Light Scattering Method (2-1) For measurements by dynamic light scattering, a measuring device of Zetasizer Nano series available from Malvern was used. The device was appropriately calibrated in advance using size standard particles (LTX3060A, LTX3200A) to reduce measurement errors to the order of 2% or less.

(2-2) A volume of 1 ml of each pre-diluted solution was put into a 12 mm square glass cell (PCS1115) and the cell was inserted into the device. Each glass cell was closed with a cap.

(2-3) For the particle type settings, the refractive index was set at 2.0, and the imaginary part was set at 0.850.

(2-4) For the solvent type settings, 2-Propanol was selected, the refractive index was set at 1.3750, and the viscosity was set at 2.038.

(2-5) The measurement temperature was set at 25° C.

(2-6) Each measurement was set to start 60 seconds after the measurement temperature was reached.

(2-7) The cell type was set to select "glass cuvette".

(2-8) The detector angle for measurement was set at 173°.

(2-9) The duration of each measurement was set to select "Automatic".

(2-10) The number of times to repeat measurement was set at 3.

(2-11) The "Measurement Position" setting was set to select "Seek for measurement position" to automatically determine an appropriate position.

(2-12) The model for smoothing the particle size distribution was set to select "General Purpose".

(2-13) Z-Average was selected to take the average of three measurements as a measurement value.

Laser Scattering Method (3-1) For measurements by laser scattering, Mastersizer 3000 available from Malvern was used as a measuring device.

(3-2) For the particle type settings, the refractive index was set at 2.0, and the imaginary part was set at 0.850.

(3-3) For solvent type settings, ethanol was selected, and the refractive index was set at 1.3600.

(3-4) Ethanol (Kanto Chemical, Cica Grade 1) was used as the dispersant in the measurements.

(3-5) A prescribed amount of ethanol was charged into a dispersion unit of the device and the unit was circulated in the device for 120 seconds.

Figure 3:
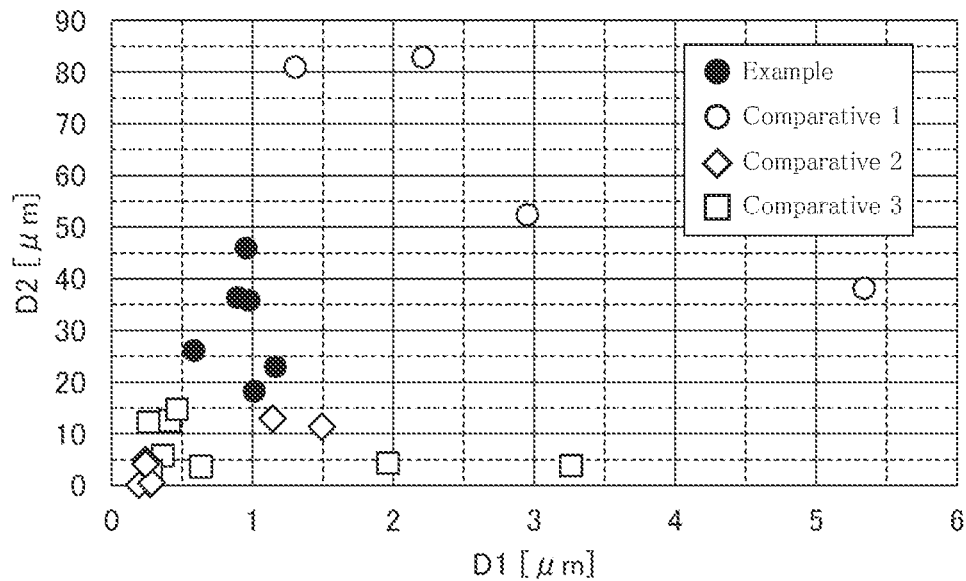
FIG. 3 is a graph showing the results of particle size measurements on ground carbon particles for electrode layers of a dielectric elastomer transducer according to the present invention.

FIG. 3 shows the results of particle size measurements by dynamic light scattering and by laser scattering. As shown in FIG. 3, according to the particle sizes D1 as measured by dynamic light scattering, the particles of Example range from 0.5 to 1.5 µm (both inclusive). The particles of Comparative Example 1 range from 1.3 to 5.4 µm. The particles of Comparative Examples 2 and 3 range from 0.1 to 3.3 µm. According to the particle sizes D2 as measured by laser scattering, the particles of Example are at least 15 µm and at most 50 µm. The particles of Comparative Example 1 are 35 µm or larger. The particles of Comparative Examples 2 and 3 are 15 µm or smaller.

Figure 4:
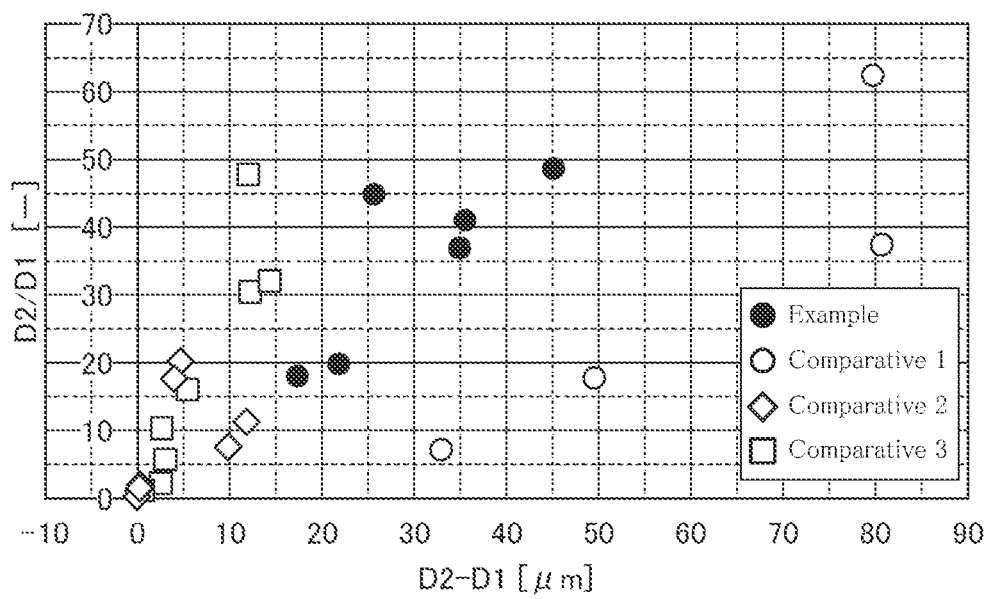
FIG. 4 is a graph showing the results of particle size measurements on ground carbon particles for electrode layers of a dielectric elastomer transducer according to the present invention.

FIG. 4 is a graph plotting the results of particle size measurements by dynamic light scattering and by laser scattering in the following manner. That is, the horizontal axis of the graph indicates the difference between the particle size D2 and the particle size D1 (D2−D1). The difference (D2−D1) of the particle sizes measured on Example is at least 15 µm. The difference on Comparative Example 1 is at least 32 µm. The differences on Comparative Examples 2 and 3 ranges from 0.1 µm to 15 µm. The vertical axis of the graph indicates the ratio between the particle size D2 and the particle size D1 (D2/D1). The ratio (D2/D1) of the particle sizes measured on Example is at least 15. The ratio on Comparative Example 1 ranges from 7 to 63. The ratios on Comparative Examples 2 and 3 ranges from 0.3 to 48.

As shown in FIG. 3, comparison of Example with Comparative Examples 1, 2 and 3 clarifies that Example satisfies the condition (Condition 1) that the particle size D1 as measured by dynamic light scattering ranges from 0.5 to 1.5 µm and that the particle size D2 as measured by laser scattering ranges from 15 to 50 µm. None of Comparative Examples 1 to 3 satisfies this condition. As can be seen from FIG. 4, Example satisfies Condition 1 in addition to at least one of: Condition 2 that the difference between the particle size D1 as measured by dynamic light scattering and the particle size D2 as measured by laser scattering (D2−D1) is at least 15 µm; or Condition 3 that the ratio between the particle size D2 as measured by laser scattering and the particle size D1 as measured by dynamic light scattering (D2/D1) is at least 15. None of Comparative Examples 1 to 3 satisfies Condition 1 in addition to at least either Condition 2 or 3.

The following describes advantages of the dielectric elastomer transducer A1 and the method for producing the dielectric elastomer transducer.

As shown in FIGS. 3 and 4, ground carbon particles derived from carbon nanotubes (as in Example) are clearly distinguished by Condition 1 from unground carbon nanotubes (as in Comparative Example 1) and common types of carbon black (as in Comparative Example 2 and 3). This is because the results of measurements by the two different methods on the ground carbon particles obtained by grinding carbon black exhibit a different tendency from those on the unground carbon nanotubes (as in Comparative Example 1) and those on the carbon black (as in Comparative Examples 2 and 3) for the following reason. When carbon nanotubes are ground, each carbon nanotube originally having a cylindrical shape is crushed to some extent and made into smaller fragments. Nevertheless, the carbon nanotubes after grinding are composed of fine particles. This results in that Example is not significantly larger or smaller than Comparative Examples 2 and 3 in terms of the particle size D1, but Example is significantly larger than Comparative Examples 2 and 3 in terms of particle size D2. In addition, Example tends to be smaller than Comparative Example 1 in terms of the particle size D1. This relation is more clearly distinguished when the particle sizes are compared based on the difference (D2−D1) and/or the ratio (D2/D1).

Therefore, electrode layers made of the ground carbon particles that satisfy Condition 1 are ensured to have good electrical conductivity and improved stretchability. The electrical conductivity is imparted by carbon nanotubes, whereas the stretchability is imparted by the fineness of ground carbon nanotubes (as indicated by the difference of the particle size D1 with Comparative Example D2). In this way, both the stretchability and the electrical conductivity of the electrode layers are ensured. Condition 1 may be appropriately combined with Condition 2 and/or Condition 3 to more clearly distinguish suitable ground carbon particles for forming electrode layers having improved stretchability and electrical conductivity.

The dielectric elastomer transducer and the method for producing a dielectric elastomer transducer according to the present invention are not limited to the specific embodiments described above. Various design changes are possible to the specific details of the elastomer transducer and the method for producing a dielectric elastomer transducer according to the present invention.

The invention claimed is:

1. A dielectric elastomer transducer comprising:
   a dielectric elastomer layer; and
   a pair of electrode layers sandwiching the dielectric elastomer layer,
   wherein the electrode layers contain ground carbon particles derived from carbon nanotubes,
   the ground carbon particles are subjected to particle size measurements by both of two different methods,
   the two different methods are dynamic light scattering and laser scattering, and
   the ground carbon particles have a particle size ranging from 0.5 to 1.5 μm as measured by the dynamic light scattering and a particle size ranging from 15 to 70 μm as measured by the laser scattering.

2. The dielectric elastomer transducer according to claim 1, wherein the ground carbon particles satisfy that a difference between the particle size as measured by dynamic light scattering and the particle size as measured by laser scattering is at least 15 μm.

3. The dielectric elastomer transducer according to claim 2, wherein the ground carbon particles satisfy that a ratio between the particle size as measured by laser scattering and the particle size as measured by dynamic light scattering is at least 15.

4. A method for producing a dielectric elastomer transducer that includes a dielectric elastomer layer and a pair of electrode layers sandwiching the dielectric elastomer layer, the method comprising:
   a step of grinding carbon nanotubes to obtain ground carbon particles; and
   a step of depositing the pair of electrode layers made of the ground carbon particles on the dielectric elastomer layer,
   the ground carbon particles are subjected to particle size measurements by both of two different methods,
   the two different methods are dynamic light scattering and laser scattering, and
   the ground carbon particles have a particle size ranging from 0.5 to 1.5 μm as measured by the dynamic light scattering and a particle size ranging from 15 to 70 μm as measured by the laser scattering.

5. The method according to claim 4, wherein the step of grinding is performed to obtain the ground carbon particles satisfying that a difference between the particle size as measured by dynamic light scattering and the particle size as measured by laser scattering is at least 15 μm.

6. The method according to claim 5, wherein the step of grinding is performed to obtain the ground carbon particles satisfying that a ratio between the particle size as measured by laser scattering and the particle size as measured by dynamic light scattering is at least 15.

7. The method according to claim 4, wherein the step of grinding includes:
   pretreatment of dispersing carbon nanotubes in a solvent to obtain a first dispersion of carbon nanotubes and removing the solvent to obtain a powder of carbon nanotubes;
   grinding the powder of carbon nanotubes into a finer powder of carbon nanotubes, mixing the finer powder of carbon nanotubes with a solvent to obtain a second dispersion of carbon nanotubes; and
   allowing the second dispersion of carbon nanotubes to stand and then extracting a portion of the second dispersion from a location near a liquid surface of the second dispersion.

\* \* \* \* \*